US006707352B2

(12) United States Patent
Kawaguchi

(10) Patent No.: US 6,707,352 B2
(45) Date of Patent: Mar. 16, 2004

(54) ELASTIC SURFACE WAVE DEVICE HAVING PARALLEL CONNECTED MAIN AND AUXILIARY FILTERS

(75) Inventor: Kyoko Kawaguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/329,548

(22) Filed: Dec. 27, 2002

(65) Prior Publication Data
US 2003/0095017 A1 May 22, 2003

Related U.S. Application Data

(63) Continuation of application No. PCT/JP01/05517, filed on Jun. 27, 2001.

(30) Foreign Application Priority Data

Jun. 27, 2000  (JP) ........................................ 2000-192761

(51) Int. Cl.[7] ................................................. H03H 9/64
(52) U.S. Cl. .................... 333/193; 333/194; 310/313 B
(58) Field of Search ................. 333/193–196; 310/313 R, 313 B, 313 C, 313 D

(56) References Cited

U.S. PATENT DOCUMENTS 4,396,851 A * 8/1983 Kishimoto et al. ..... 310/313 B
6,049,260 A * 4/2000 Yoshimoto et al. ......... 333/194
6,313,717 B1 * 11/2001 Dufilie et al. ............... 333/193
6,462,633 B1 * 10/2002 Ichikawa .................... 333/193
6,476,691 B1 * 11/2002 Tsuzuki et al. ............. 333/193

FOREIGN PATENT DOCUMENTS

JP     56-78221 A      6/1981
JP     4-196809 A      7/1992
JP     2003-17982    * 1/2003
WO     WO 00/70758   * 11/2000

* cited by examiner

Primary Examiner—Barbara Summons
(74) Attorney, Agent, or Firm—Oblon, Spivak, McClelland, Maier & Neustadt, P.C.

(57) ABSTRACT

An elastic surface wave device comprises a main elastic surface wave filter formed on a piezoelectric substrate made of monocrystalline lithium tetraborate and an auxiliary elastic surface wave filter formed on said piezoelectric substrate and connected in parallel with the main elastic surface wave filter to cancel the higher frequency side unnecessary component attributable to the bulk wave contained in the output of the main elastic surface wave filter.

3 Claims, 2 Drawing Sheets

ELASTIC SURFACE WAVE DEVICE HAVING PARALLEL CONNECTED MAIN AND AUXILIARY FILTERS

CROSS-REFERENCE TO RELATED APPLICATIONS

This is a Continuation Application of PCT Application No. PCT/JP01/05517, filed Jun. 27, 2001, which was not published under PCT Article 21(2) in English.

This application is based upon and claims the benefit of priority from the prior Japanese Patent Application No. 2000-192761, filed Jun. 27, 2000, the entire contents of which are incorporated herein by reference.

BACKGROUND OF THE INVENTION

1. Field of the Invention

This invention relates to an improvement in a transversal filter type elastic surface wave device.

2. Description of the Related Art

A transversal type elastic surface wave device is normally manufactured in a manner as described below. A metal film, such as an aluminum (Al) film, is formed on a piezoelectric substrate typically made of lithium tetraborate (LBO) and processed by lithography to produce comb-shaped electrodes and shield electrodes.

The comb-shaped electrodes include input side comb-shaped electrodes, output side comb-shaped electrodes and shield electrodes arranged between the input side comb-shaped electrodes and the output side comb-shaped electrodes.

In a transversal type elastic surface wave device, an elastic surface wave excited by the input side comb-shaped electrode is transmitted to the output side comb-shaped electrode. A bulk wave is generated at this time and propagated to the output side comb-shaped electrode. The generated bulk wave gets to the output side electrode after the surface wave that is propagated along the surface of the piezoelectric substrate gets there because it is propagated through the inside of the piezoelectric substrate.

As a result, it is found by analyzing the output signal of the output side comb-shaped electrode that a high frequency component is generated by the bulk wave at the higher frequency side of the pass band of the proper elastic surface wave. Therefore, the filter of the elastic surface wave device appears to be poorly effective for attenuation at the higher frequency side.

Measures taken for tackling this problem, include forming grooves on the back surface of the piezoelectric substrate opposite the side where the electrodes are arranged, processing in a rough finish on the back surface of the substrate or applying a sound absorbing material on the surface of the substrate. However, an elastic surface wave device comprising a substrate made of lithium tetraborate shows a large response to the bulk wave if compared with a device comprising a crystal substrate. Therefore, none of the above listed measures for suppressing the bulk wave are sufficient.

BRIEF SUMMARY OF THE INVENTION

In view of the above identified circumstances, it is therefore an object of the present invention to provide an elastic surface wave device that can suppress the high frequency component generated by unnecessary waves, including the bulk wave, to a practically feasible level and shows an excellent band pass characteristic.

Another object of the present invention is to provide an elastic surface wave device that can suppress the high frequency component generated by unnecessary waves including the bulk wave to a practically feasible level and be prepared by using a substrate made of lithium tetraborate.

According to the invention, the above objects and other objects are achieved by providing an elastic surface wave device comprising:

- a main elastic surface wave filter having input side comb-shaped electrodes, shield electrodes and output side comb-shaped electrodes formed on a piezoelectric substrate; and
- an auxiliary elastic surface wave filter connected in parallel with the main elastic surface wave filter and having input side comb-shaped electrodes, shield electrodes and output side comb-shaped electrodes formed on the piezoelectric substrate;
- the auxiliary elastic surface wave filter having a canceling high pass band for reducing the high frequency component generated by a bulk wave at the higher frequency side of the pass band of the main elastic surface wave filter on the frequency axis.

DETAILED DESCRIPTION OF THE INVENTION

Now, the present invention will be described by referring to the accompanying drawings that illustrate a preferred embodiment of the invention.

Figure 1:
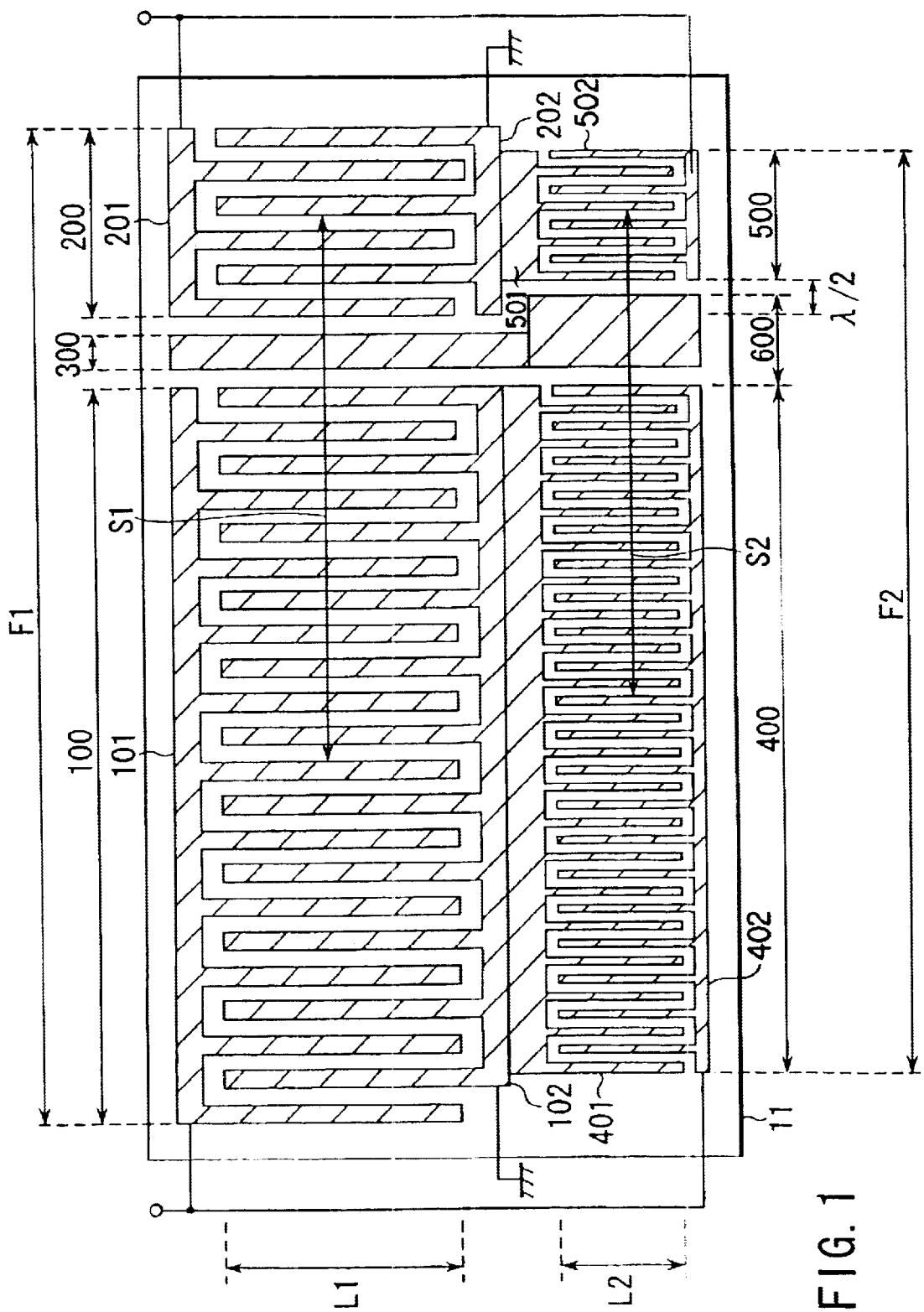
FIG. 1 is a schematic plan view of an embodiment of elastic surface wave device according to the invention, showing the surface (filter device surface) thereof.

FIG. 1 is a schematic illustration of the embodiment of the invention. Referring to FIG. 1, reference symbol 11 denotes a piezoelectric substrate made of monocrystalline lithium tetraborate.

A main elastic surface wave filter F1 and an auxiliary elastic surface wave filter F2 are formed on the piezoelectric substrate 11. The main elastic surface wave filter F1 has a function of filtering the proper input signal, whereas the auxiliary elastic surface wave filter F2 operates as an unnecessary component canceling filter for reducing the high frequency wave component of the bulk wave in the embodiment.

As far as the embodiment is concerned, the expression "the bulk wave" refers to the propagated waves other than the surface wave that is propagated along the surface of the piezoelectric substrate.

Firstly, the configuration of the main elastic surface wave filter F1 of the embodiment will be described.

An input side comb-shaped electrode (also referred to as an input interdigital transducer (IDT)) 100 and an output side comb-shaped electrode (also referred to as an output interdigital transducer (IDT)) 200 are formed on the piezoelectric substrate 11 with a shield electrode 300 arranged between the input side comb-shaped electrode 100 and the output side comb-shaped electrode 200.

The input side comb-shaped electrode 100 comprises first and second common electrodes 101, 102 composed of respective comb-shaped electrode fingers that are arranged interdigitally. The output side comb-shaped electrode 200 comprises first and second common electrodes 201, 202 composed of respective comb-shaped electrode fingers that are also arranged interdigitally.

The input side comb-shaped electrode 100, the output side comb-shaped electrode 200 and the shield electrode are prepared by forming metal films such as an aluminum (Al) film on the piezoelectric substrate 11 that is made of monocrystalline lithium tetraborate and processing the metal film typically by means of lithography. In reality, a large number of elements (input side IDTs, output side IDTs and shield electrodes) are formed on a wafer (piezoelectric substrate) made of monocrystalline lithium tetraborate.

The effective aperture L1 (the effective length of the electrode fingers) of the input and output IDTs of the main filter F1 is about 0.5 mm and the pitch of the arrangement of the electrode fingers (the distance between the centers of any two adjacently located electrode fingers) is about 4.25 $\mu$m.

Now, the auxiliary elastic surface wave filter F2 will be described.

Like the auxiliary elastic surface wave filter F2, an input side comb-shaped electrode (also referred to as an input interdigital transducer (IDT)) 400 and an output side comb-shaped electrode (also referred to as an output interdigital transducer (IDT)) 500 are formed on the piezoelectric substrate 11 with a shield electrode 600 arranged between the input side comb-shaped electrode 400 and the output side comb-shaped electrode 500.

The input side comb-shaped electrode 400 comprises first and second common electrodes 401, 402 composed of respective tooth-like electrode fingers that are arranged interdigitally. The output side comb-shaped electrode 500 comprises first and second common electrodes 501, 502 composed of respective tooth-like electrode fingers that are also arranged interdigitally. The first common electrode 401 of the input side comb-shaped electrode 400 is linked to the second common electrode 102 of the main elastic surface wave filter F1. The first common electrode 501 of the output side comb-shaped electrode 500 is linked to the second common electrode 202 of the main elastic surface wave filter F1. The shield electrodes 300, 600 of the main and auxiliary elastic surface wave filters F1, F2 are linked to each other. Of the elastic surface wave device, typically, the common electrodes, 102, 401 are connected to a grounding line and the common electrodes 101, 402 are connected to an input signal line, whereas the common electrodes 202, 501 are connected to the grounding line and the common electrodes 201, 502 are connected to an output signal line. Alternatively, it may be so arranged that the common electrodes 102, 401 are connected to the input signal line and the common electrodes 101, 402 are connected to the grounding line, whereas the common electrodes 202, 501 are connected to the output signal line and the common electrodes 201, 502 are connected to the grounding line.

The effective aperture L2 (the effective length of the electrode fingers) of the input and output IDTs of the auxiliary filter F2 is about 0.1 to 0.2 mm and the pitch of the arrangement of the electrode fingers (the distance between the centers of any two adjacently located electrode fingers) is about 4 $\mu$m.

Now, the operation of this embodiment of the elastic surface wave device will be described below by referring to FIGS. 2 through 4. In each of the graphs of FIGS. 2 through 4, the horizontal axis indicates the frequency (MHz) and the vertical axis indicates the attenuation (dB).

Figure 2:
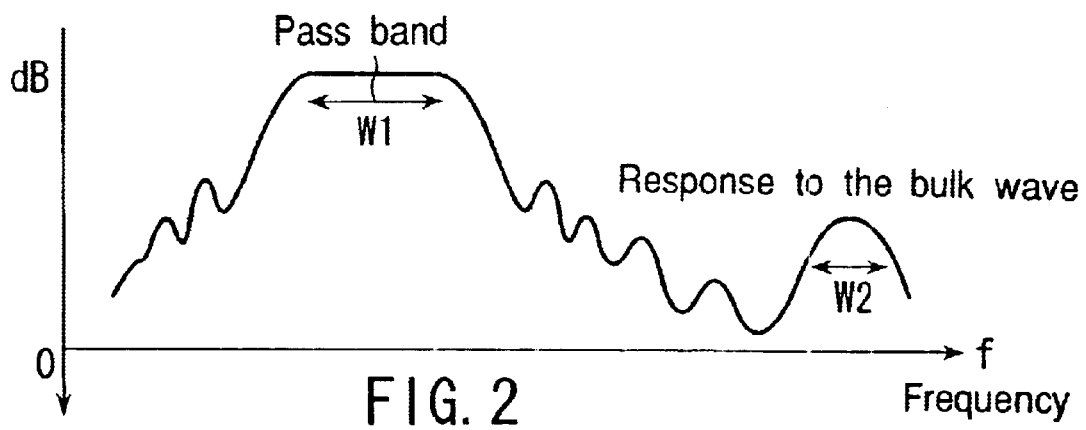
FIG. 2 is a graph illustrating the frequency characteristic of the main elastic surface wave filter of FIG. 1.

FIG. 2 illustrates the frequency characteristic of only the main elastic surface wave filter F1. The main elastic surface wave filter F1 is so designed to have a pass band W1. However, it shows a frequency response band W2 which is located at the higher frequency side relative to the pass band W1. The high frequency response band is attributable to the bulk wave propagated toward the inside of the piezoelectric substrate 11. The propagation velocity of bulk waves is known to be higher than that of surface waves (SAW). The propagation velocity of the bulk wave is about 4,000 m/sec. and that of the SAW is about 3,500 m/sec. in the piezoelectric substrate of this embodiment.

On the other hand, the auxiliary elastic surface wave filter F2 generates an excitation wave whose phase is inverted relative to that of the bulk wave of the main elastic surface wave filter F1. As a result, the auxiliary elastic surface wave filter F2 shows a frequency response characteristic as shown in FIG. 3. The main pass band W3 of the frequency response band of the auxiliary elastic surface wave filter F2 is designed to substantially agree with the frequency response band W2 at the higher frequency side that is attributable to the response to the bulk wave of the main elastic surface wave filter F1.

Preferably, it is so designed that the extent of attenuation of the filter F1 in the band W2 and that of the filter F2 in the band W3 substantially agree with each other.

Additionally, it is so designed that the phase of the signal component that appears in the band W3 is inverted relative to that of the high frequency component that appears in the frequency response band W2. The two phases can be easily inverted relative to each other in a well regulated manner by modifying the length of the propagation path (the gap between the input/output IDTs) of the filter F2 on a basis of a unit of n$\lambda$ to (n+1)$\lambda$ ($\lambda$ being the wavelength of the elastic surface wave).

More specifically, as the length of the propagation path is modified by a half of the wavelength (or by the length of a half of the wavelength multiplied by an odd number), the phase of the surface wave as detected by the output IDT becomes inverted. In reality, since the propagation path of the bulk wave is complex (because the bulk wave may be scattered on the substrate surface for example), the length of the propagation path of the filter F2 may have to be regulated slightly by referring to a half of the wavelength. However, those who skilled in the art can experimentally perform such regulation with ease.

As the positional arrangement of the electrode fingers of the output side comb-shaped electrode 500 is determined in this way, any unnecessary components that may appear in the band W2 are cancelled by the additional components that may appear in the band W3 correspondingly.

In this embodiment of an elastic surface wave device according to the invention, the effective aperture L1 of the filter F2 is smaller than that of the filter F1 and the pitch of arrangement of the electrode fingers of the filter F2 is smaller than that of the electrode fingers of the filter F1 for the reason as described below.

Firstly, the relationship between the pitch of arrangement of the electrode fingers of the filter F1 and that of the electrode fingers of the filter F2 will be discussed. The bulk wave response band W2 of the filter F1 appears at the higher frequency side of the main pass band W1. In this embodiment, the main path band W3 of the elastic surface wave of the filter F2 is made to be found at the higher frequency side relative to the main pass band W1 of elastic surface wave of the filter F1 in order to cancel the response to the bulk wave by the response of the elastic surface wave of the filter F2. Because the main path band W3 is found at the higher frequency side relative to the main pass band W1 of the filter F1, the pitch of arrangement of the electrode fingers of the filter F2 needs to be made smaller than that of the electrode fingers of the filter F1. For this reason, in this embodiment, the pitch of the electrode fingers in the arrangement of the filter F1 is made equal to about 4.25 µm and that of the electrode fingers of the filter F2 is made equal to about 4 µm.

Now, the relationship between the filter apertures of the two filters will be discussed below. As shown in FIG. 2, the response to the bulk wave of the filter F1 is smaller than its response to the elastic surface wave. Therefore, the response of the filter F2 can be made correspondingly small to cancel the response to the bulk wave of the filter F1.

One of the determinant factors of the size of response is the effective aperture of the IDT of the filter. The response is large when the effective aperture is large, whereas the response is small when the effective aperture is small. Therefore, in this embodiment, the response (W3) is made to be exactly large enough for canceling the response to the bulk wave of the filter F1 by making the effective aperture of the filter F2 smaller than that of the filter F1. In terms of insertion loss, the insertion loss of the filter F2 is greater than that of the filter F1 by more than 10 dB.

The influence of the bulk wave that can be generated in the filter F2 can be made negligible by making the effective aperture of the filter F2 sufficiently small. The ratio of the effective aperture L2 of the filter F2 to the effective aperture L1 of the filter F1 (L2/L1) is made not greater than ½, preferably between ⅕ and ⅖.

The difference between the propagation velocity of a bulk wave and that of a surface wave needs to be taken into consideration in addition to the above described phase relationship when determining the propagation path length of the filter F1 and that of the filter F2. More specifically, the response to the bulk wave of the filter F1 and the response to the surface wave of the filter F2 need to agree with each other temporally and their phases need to be inverted relative to each other. As pointed out above, the propagation velocity of a bulk wave is 4,000 m/sec. and that of the surface waves is about 3,500 m/sec in this embodiment, making the latter smaller than the former. When the distance S1 between the centers of the input/output IDTs of the filter F1 and the distance S2 between the centers of the input/output IDTs of the filter F2 are compared, it will be appreciated that S2 is made smaller than S1 for the purpose of correcting the difference in velocity. In other words, the duration of the response to the surface wave of the filter F2 is made equal to that of the response to the bulk wave of the filter F1 by reducing the distance required for the surface wave to travel to the filter F2.

Figure 3:
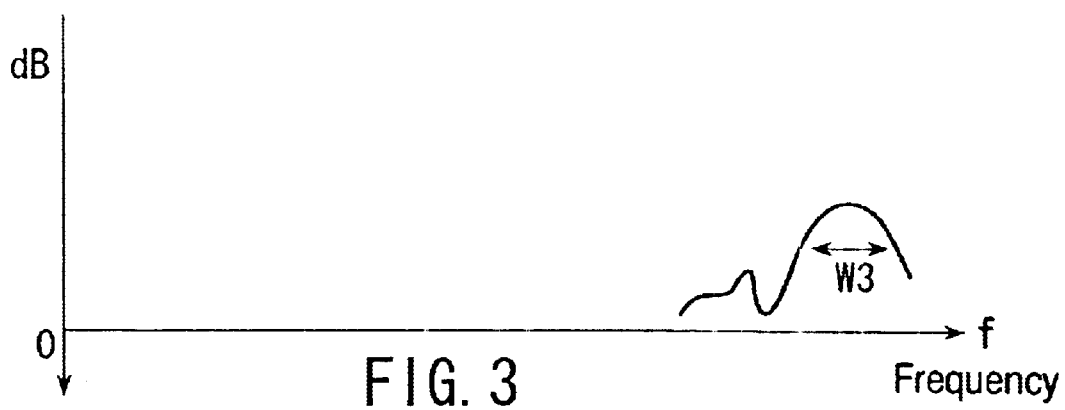
FIG. 3 is a graph illustrating the frequency characteristic of the auxiliary elastic surface wave filter of FIG. 1.
Figure 4:
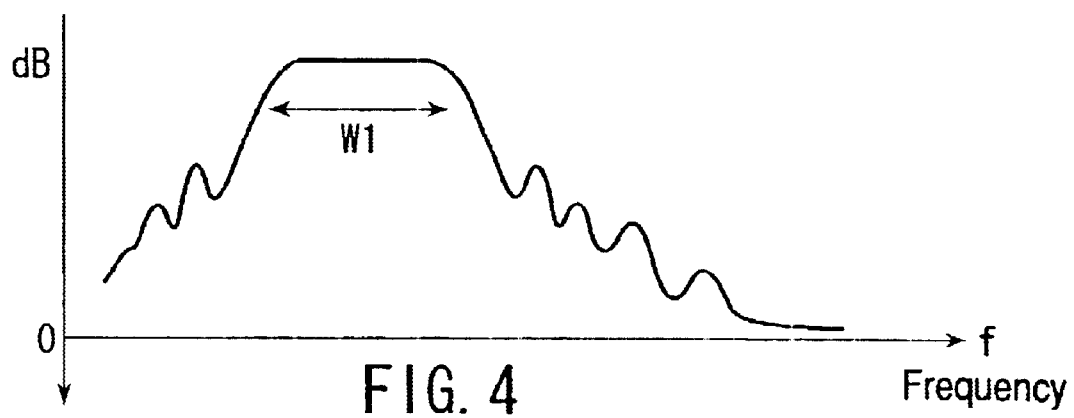
FIG. 4 is a graph illustrating the frequency characteristic of the entire elastic surface wave device of FIG. 1 obtained by combining the frequency characteristic of FIG. 2 and that of FIG. 3.

FIG. 4 is a graph illustrating the frequency response characteristic obtained by combining those of FIGS. 2 and 3. Thus, an elastic surface wave device according to the invention shows a frequency response characteristic (obtained by canceling the unnecessary component appearing in the band W2 by the additional component appearing in the band W3) as shown in FIG. 4.

The above described elastic surface wave device typically has a width between about 1.5 mm and about 2.1 mm, a length between about 8 mm and about 12 mm and a height of about 0.5 mm.

The width, the length and the thickness of the electrode fingers also affect the propagation efficiency and the propagation direction of the elastic surface wave (SAW). Therefore, the main elastic surface wave filter F1 is designed on the basis of the frequency of the surface wave to be used. As the frequency characteristic of the main elastic surface wave filter F1 is determined, it is possible to determine the band of the high frequency component of the bulk wave and its frequency characteristic from experimental data. Then, it is possible to design the auxiliary elastic surface wave filter F2 to make it show a frequency response characteristic that corresponds to the frequency characteristic of the unnecessary component of the bulk wave. Thereafter, the phase of the output signal of the auxiliary elastic surface wave filter F2 is made to be inverted relative to that of the unnecessary component. The phase can be regulated by shifting the positions of the electrode fingers of the auxiliary elastic surface wave filter F2 by $\lambda/2$ in the propagation direction of the elastic surface wave filter. Therefore, in the design stages, firstly the phase of the unnecessary component is observed by inputting a predetermined signal to the main elastic surface wave filter F1. Secondly, the phase of the canceling output signal of the auxiliary elastic surface wave filter F2 is observed by entering a predetermined signal to it in order to determine the difference between the phase of the unnecessary component and that of the canceling output signal. Thirdly, the auxiliary elastic surface wave filter F2 is positioned on the basis of the determined phase difference. As the equation of frequency response is determined, it is now possible to transform it to a response characteristic on the time axis by means of a Fourier transform. The response characteristic on the time axis corresponds to the positions of the electrode fingers where the elastic surface wave is propagated.

The band width of the above described elastic surface wave device is typically centered at 210.38 MHz that is the center frequency of mobile telephone systems using the CDMA method with a width of about ±1 MHz. The band width of the target bulk wave is between about 213 MHz and about 215 MHz.

The piezoelectric device may be made of crystal for the purpose of the present invention. Then, the operation of processing the rear surface of the substrate can be simplified. The width and the number of the electrode fingers are only schematically illustrated in FIG. 1 and the present invention is by no means limited to those illustrated there. A combination of $\lambda/8$ and $\lambda/16$ may be used for determining the width of the electrode fingers.

An elastic surface wave device according to the invention can find applications in intermediate frequency filters that are used in mobile telephone sets and general purpose filters.

What is claimed is:

1. An elastic surface wave device comprising:

a main elastic surface wave filter having an input side comb-shaped electrode and an output side comb-shaped electrode formed on a piezoelectric substrate; and an auxiliary elastic surface wave filter connected in parallel with said main elastic surface wave filter and having an input side comb-shaped electrode and an output side comb-shaped electrode formed on said piezoelectric substrate;

the input side comb-shaped electrode and the output side comb-shaped electrode of said auxiliary elastic wave filter being adapted to excite an elastic surface wave showing a phase inverted relative to the phase of an unnecessary wave generated at the higher frequency side of the pass band of said main elastic surface wave filter and having a principal pass band at a position overlapping the response of said unnecessary wave on the frequency axis, wherein the effective aperture L1 of the comb-shaped electrodes of said main elastic surface wave filter and the effective aperture L2 of the comb-shaped electrodes of said auxiliary elastic surface wave filter show a relationship of L1>L2.

2. The device according to claim 1, wherein the loss of said auxiliary elastic surface wave filter alone is greater than the loss of said main elastic surface wave filter alone by about 10 dB.

3. The device according to claim 1, wherein the distance S1 between the center of the input side comb-shaped electrode and that of the output side comb-shaped electrode of said main elastic surface wave filter and the distance S2 between the center of the input side comb-shaped electrode and that of the output side comb-shaped electrode of said auxiliary elastic surface wave filter show a relationship of S1>S2.

* * * * *